(12) United States Patent
Aram

(10) Patent No.: US 7,276,969 B1
(45) Date of Patent: Oct. 2, 2007

(54) MULTI-AMPLIFIER CIRCUIT

(75) Inventor: Farbod Aram, Los Altos Hills, CA (US)

(73) Assignee: Marvell International Ltd, Hamilton (BM)

( * ) Notice: Subject to any disclaimer, the term of this patent is extended or adjusted under 35 U.S.C. 154(b) by 0 days.

(21) Appl. No.: 10/792,619

(22) Filed: Mar. 3, 2004

(51) Int. Cl.
H03F 3/45 (2006.01)
(52) U.S. Cl. .................. 330/253; 330/260; 330/310
(58) Field of Classification Search ............... 330/253, 330/310, 260
See application file for complete search history.

(56) References Cited

U.S. PATENT DOCUMENTS

| | | | |
|---|---|---|---|
| 5,220,686 A * | 6/1993 | Kasperkovitz et al. ....... | 330/98 |
| 5,225,790 A * | 7/1993 | Noguchi et al. ............ | 330/260 |
| 6,121,831 A * | 9/2000 | Mack ........................ | 330/254 |
| 6,201,442 B1 * | 3/2001 | James et al. ................ | 330/107 |
| 6,466,091 B1 | 10/2002 | Kejariwal et al. .......... | 330/144 |
| 6,515,540 B1 | 2/2003 | Prasad et al. ................ | 330/9 |
| 6,525,589 B1 | 2/2003 | Thomsen et al. ........... | 327/379 |
| 6,657,487 B2 * | 12/2003 | Lauffenburger et al. | 330/124 R |

OTHER PUBLICATIONS

IEEE Standard 802.11a (1999 Edition; Amended 2000); Supplement to IEEE Standard for Information Technology; Telecommunications and Information Exchange Between Systems; Local and Metropolitan Area Networks; Specific Requirements; Part 11: Wireless LAN Medium Access Control (MAC) and Physical Layer (PHY) Specifications; High-Speed Physical Layer in the 5 GHz Band, pp. 1-91.

IEEE Standard 802.11b (Sep. 16, 1999 Edition) Supplement to IEEE Standard for Information Technology; Telecommunications and Information Exchange Between Systems; Local and Metropolitan Area Networks; Specific Requirements; Part 11: Wireless LAN Medium Access Control (MAC) and Physical Layer (PHY) Specifications; Higher-Speed Physical Layer Extension ni the 2.4 GHz Band, pp. 1-96.

IEEE Standard P802.11g, Draft Supplement to Standard for Information technology—Telecommunications and information exchange between systems— Local and metropolitan area networks—Specific requirements, Part 11: Wireless LAN Medium Access Control (MAC) and Physical Layer (PHY) specifications: Further Higher Data Rate Extension in the 2.4 GHz Band, Apr. 2003, pp. 1-69.

(Continued)

Primary Examiner—Khanh Van Nguyen

(57) ABSTRACT

A transimpedance amplifier circuit includes a first amplifier with an input, an output and a first transconductance. A second amplifier has an input that communicates with the output of the first amplifier, an output and a second transconductance. A first resistance has one end that communicates with the input of the first amplifier. An inverter has an input that communicates with the output of the second amplifier and an output that communicates with an opposite end of the first resistance. A second resistance has one end that communicates with the input of the second amplifier and an opposite end that communicates with the output of the second amplifier. A third resistance has one end that is connected to the output of the second amplifier. A first capacitance has one end that communicates with the one end of the first resistance and an opposite end that communicates with the opposite end of the first resistance.

10 Claims, 9 Drawing Sheets

OTHER PUBLICATIONS

IEEE Standard 802.16-2001, IEEE Standard for Local and metropolitan area networks, Part 16: Air Interface for Fixed Broadband Wireless Access Systems, pp. 1-349.

W. Grise, Dept. of IET, Morehead State University, Morehead, KY; Application of the Operational Transconductance Amplifier (OTA) to Voltage-controlled Amplifiers and Active Filters; 10 pages.

Axel Thomsen, Dan Kasha, Wai Lee, Crystal Semiconductor Division, Cirrus Logic, Inc., Austin, Texas; A Five Stage Chopper Stabilized Instrumentation Amplifier Using Feedforward Compensation; 1998; 4 pages.

Axel Thomsen, Edwin de Angel, Sherry Ziachong Wu, Aryesh Amar, Lei Wang, Wai Lee, WA 20.1 A DC Measurement IC with 130nV$_{pp}$ Noise in 10Hz; 2000 IEEE International Solid-State Circuits Conference; 9 pages.

Axel Thomsen, Edwin de Angel, Sherry Ziachong Wu, Aryesh Amar, Lei Wang, Wai Lee, WA 20.1 A DC Measurement IC with 130nV$_{pp}$ Noise in 10Hz; ISSCC 2000/Session 20/Oversampled Converters/Paper WA 20.1 ISSCC 2000 Slide Supplement; 5 pages.

M. Moyal, M. Groepl, H. Werker, G. Mitteregger, J. Schambacher; Xignal Technologies AG, Munich, Germany; 23.6 A 700/900mW/Channel CMOS Dual Analog Front-End IC for VDSL with Integrated 11.5/14.5dBm Line Drivers; 2003 IEEE International Solid-State Circuits Conference; ISSCC 2003/Session 23/Mixed-Signal and Wireline Techniques; 10 pages.

M. Moyal, M. Groepl, H. Werker, G. Mitteregger, J. Schambacher; Xignal Technologies AG, Munich, Germany; A 700/900mW/Channel CMOS Dual Analog Front-End IC for VDSL with Integrated 11.5/14.5dBm Line Drivers; Outline, Overview 24 pages.

* cited by examiner

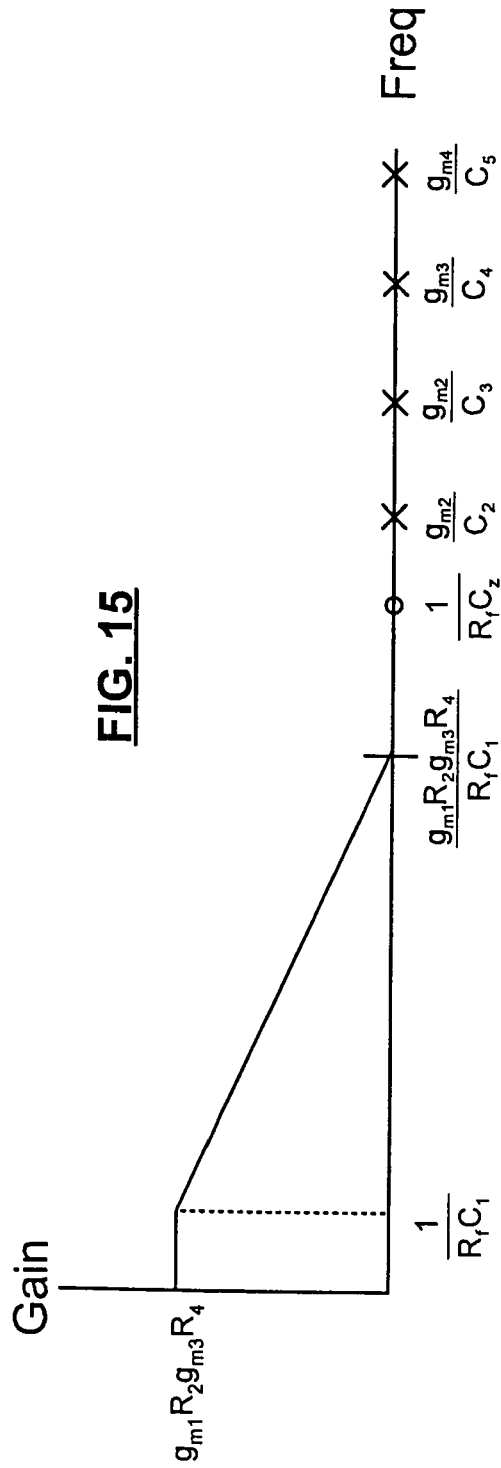

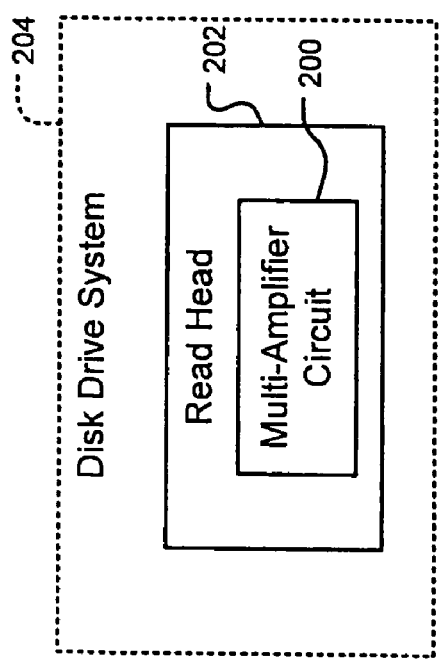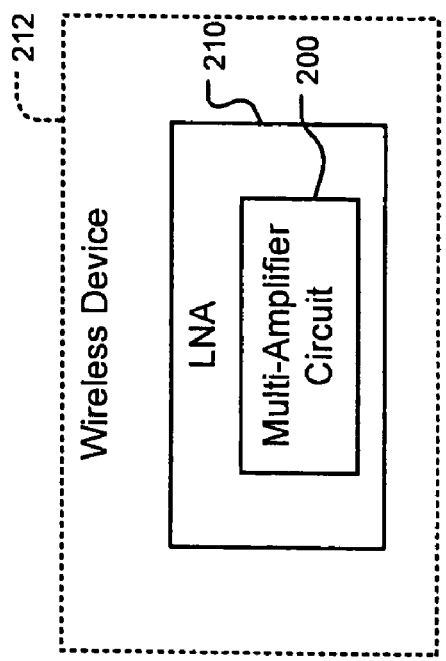

US 7,276,969 B1

MULTI-AMPLIFIER CIRCUIT

FIELD OF THE INVENTION

The present invention relates to amplifier circuits, and more particularly to multi-stage amplifier circuits.

BACKGROUND OF THE INVENTION

Referring now to FIGS. 1 and 2, a transimpedance amplifier (TIA) circuit is shown and includes an inverting amplifier having a transconductance $g_m$, a load resistance $R_L$, and a feedback resistance $R_f$. As is known, the TIA circuit converts an input current $I_{in}$ to an output voltage $V_o$. Several characteristics of the amplifier circuit in FIG. 1 are described below, including gain, input impedance, output impedance, and noise. The gain of the amplifier circuit:

$$\text{Gain} = \frac{v_o}{i_{in}} = -R_f + \frac{1}{g_m}.$$

For many implementations, $R_f$ is much larger than $$\frac{1}{g_m}$$

such that the gain is essentially equal to $-R_f$.

The input impedance $R_{in}$ of the amplifier circuit of FIG. 1 is as follows:

$$R_{in} = \frac{1}{g_m}\left(1 + \frac{R_f}{r_L}\right)$$

Thus, the input impedance $R_{in}$ is a function of the load resistance $R_L$, as well as the feedback resistance $R_f$ and the transconductance $g_m$. The output impedance $R_o$ is equal to $$\frac{1}{g_m}$$

at low frequency. However, due to parasitic capacitance $C_1$, the output impedance increases to the value of the feedback resistance $R_f$ for frequencies greater than $$\frac{1}{R_f C_1},$$

as is illustrated generally in FIG. 2.

Assuming the feedback resistance $R_f$ is much greater than $$\frac{1}{g_m},$$

the noise at the input of the amplifier circuit is:

$$\text{Noise} = \frac{4KT}{g_m}$$

Thus, the noise is independent of the feedback resistance $R_f$ and the load resistance $R_L$, and inversely related to the transconductance $g_m$. Note that K is Boltzmann's constant and T is temperature. Therefore, reducing noise generally involves increasing the transconductance $g_m$.

One advantage of the amplifier circuit of FIG. 1 is that while noise is closely related to the transconductance $g_m$, the input impedance $R_{in}$ is not. Therefore, noise can be set to a desired level by adjusting the transconductance $g_m$. The desired input impedance $R_{in}$ can then be obtained by adjusting the feedback and load resistances $R_f$ and $R_L$, respectively. In this sense, the noise and input impedance of the amplifier circuit of FIG. 1 are relatively independent.

In contrast, the input impedance and noise of differential TIAs are both dependent on the transconductance $g_m$. Specifically, the input impedance $R_{in}$ is equal to $$\frac{1}{g_m}$$

and the noise is equal to $$\frac{4KT}{g_m}.$$

Accordingly, adjusting the noise level will affect the input impedance and vice versa in differential TIAs.

Referring now to FIG. 3, it is difficult to obtain high gain from a transimpedance amplifier while maintaining relatively flat input impedance and noise levels at high frequencies. As noted above, to have low noise, the transconductance $g_m$ must be relatively large. For most transistors, the transconductance $g_m$ is given by the following equation:

$$g_m = \sqrt{\frac{2KIW}{L}}$$

Where W is width, L is length, and I is current. To increase the transconductance $g_m$, the width W of the device and/or the current I can be increased. As can be seen from the following equations, however, the width W is proportional to the parasitic capacitances $C_1$ and $C_2$:

$C_1 = C_{ox}WL$; and $C_2 \propto W$.

Where $C_{ox}$ is oxide capacitance. Thus, increasing the width W to increase the transconductance $g_m$ also increases the parasitic capacitances $C_1$ and $C_2$. The effects of the larger parasitic capacitances on circuit performance (specifically input impedance, gain, and bandwidth) are discussed further below.

Referring now to FIG. 4, the general equation for input impedance is set forth above. However, if the value of capacitance $C_2$ increases, at some frequency it shunts the load resistance $R_L$ such that the equation for input impedance becomes:

$$R_{in} = \frac{1}{g_m}\left(1 + \frac{R_L C_2}{R_L + C_2}\right)$$

FIG. 4 illustrates this relationship. As shown therein, the input impedance is initially flat. As frequency increases, the impedance of capacitor $C_2$ decreases and begins to reduce the impedance of the parallel combination of capacitor $C_2$ and the load resistance $R_L$. This, in turn, increases the input impedance $R_{in}$ starting at a frequency of about $$\frac{1}{C_2 R_L}.$$

At even higher frequencies, the input impedance may drop off due to circuit performance, as shown in FIG. 4. Thus, one problem with the amplifier circuit of FIG. 1 is that reducing noise also requires increasing the transconductance $g_m$. Increasing the transconductance $g_m$, in turn, increases the parasitic capacitance and can adversely impact the input impedance $R_{in}$ at certain frequencies.

Referring now to FIG. 5, to achieve high gain, a high feedback resistance $R_f$ is typically needed. However, the transistor has an output impedance $r_o$ and a load impedance $R_L$. Usually $R_L$ is much greater than $r_o$. The equation for $r_o$ is:

$$r_o = \frac{T \cdot L}{g_m}.$$

Where T represents a constant typically having a value of about 100 and L represents the length of the device. Therefore, given a value for $$\frac{1}{g_m}$$

of 5 ohms and a device length of 0.25 microns, $r_o$ will be approximately 125 ohms. Assuming the load impedance $R_L$ is infinite, the equation for input impedance $R_{in}$ is:

$$R_{in} = \frac{1}{g_m} 1 + \left(\frac{R_f(R_L + r_o)}{R_L r_o}\right).$$

If an input impedance of 50 ohms is used, the feedback resistance $R_f$ is limited to approximately 1125 ohms.

Increasing the size of the device adversely impacts the input impedance $R_{in}$ at high frequencies because of the increased capacitance. Increasing the size of the device also limits the value of the load impedance $R_L$. Limiting $R_L$ also limits the value of the feedback resistance $R_f$ and adversely impacts the gain at DC.

Referring now to FIG. 6, in order to derive the bandwidth of an amplifier with feedback, an open loop response technique is used to provide information relating to the bandwidth and maximum achievable bandwidth of a circuit. The DC gain of the open loop response is determined by opening the feedback loop and attaching a voltage source to one end of the feedback loop as shown in FIG. 6. The output voltage is sensed at the other end of the feedback loop.

To derive the bandwidth, the DC gain of the open loop response and the first dominant pole $P_1$ are found. Assuming stable operation, there is only one pole $P_1$ that is located below a crossover frequency. The crossover frequency is the product of the DC gain of the open loop response and the first dominant pole $P_1$. The crossover frequency defines the bandwidth of the closed loop amplifier. The maximum available bandwidth is related to the second non-dominant pole $P_2$.

Referring now to FIG. 7, the response of the amplifier circuit of FIG. 6 is shown. The DC gain of the open loop response is $g_m R_L$ and the circuit has a dominant pole at $$\frac{1}{R_f(C_1 + C_2)}.$$

Multiplying the DC gain of the open loop response with $P_1$ provides a crossover frequency of $$\frac{g_m R_L}{R_f(C_1 + C_2)}.$$

Further the circuit arrangement has a non-dominant pole at $$\frac{1}{C_L R_2},$$

which relates to a barrier frequency or maximum achievable bandwidth. Increasing the transconductance $g_m$ increases the parasitic capacitances $C_1$, $C_2$. If the load impedance $R_L$ is less than the feedback resistance $R_f$, then the second component of the equation $$\left(\text{i.e., } \frac{R_L}{R_f}\right)$$

is less than unity. Thus, it should be understood that there is a maximum bandwidth that can be obtained, which is basically $$\frac{g_m}{C},$$

which limits the speed of the circuit.

SUMMARY OF THE INVENTION

A transimpedance amplifier circuit comprises a first amplifier with an input, an output and a first transconductance. A second amplifier has an input that communicates with the output of the first amplifier, an output and a second transconductance. A first resistance has one end that communicates with the input of the first amplifier. An inverter has an input that communicates with the output of the second amplifier and an output that communicates with an opposite end of the first resistance.

In other features, the first transconductance is greater than the second transconductance. A second resistance has one end that communicates with the input of the second amplifier and an opposite end that communicates with the output of the second amplifier. A third resistance has one end that is connected to the output of the second amplifier.

In still other features, a first capacitance has one end that communicates with the one end of the first resistance and an opposite end that communicates with the opposite end of the first resistance.

A transimpedance amplifier circuit comprises a first amplifier with an input, an output and a first transconductance. A second amplifier has an input that communicates with the output of the first amplifier, an output and a second transconductance. A first resistance has one end that communicates with the input of the first amplifier. A third amplifier has an input that communicates with the output of the second amplifier, an output and a third transconductance. A fourth amplifier has an input that communicates with the output of the third amplifier, an output and a fourth transconductance. An inverter has an input that communicates with the output of the fourth amplifier and an output that communicates with an opposite end of the first resistance.

In other features, the first transconductance is greater than the second transconductance and the second transconductance is greater than the third and fourth transconductances. The second transconductance is approximately equal to one-fourth of the first transconductance. The third and fourth transconductances are approximately equal to one-twelfth of the first transconductance.

In yet other features, a second resistance has one end that communicates with the input of the second amplifier and an opposite end that communicates with the output of the second amplifier. A third resistance has one end that communicates with the input of the fourth amplifier and an opposite end that communicates with the output of the fourth amplifier. A first capacitance has one end that communicates with the one end of the first resistance and an opposite end that communicates with an opposite end of the first resistance.

A differential transimpedance amplifier circuit comprises a first amplifier with an input, an output and a first transconductance. A second amplifier has an input that communicates with the output of the first amplifier, an output and a second transconductance. A first resistance has one end that communicates with the input of the first amplifier. A second resistance has one end that communicates with the input of the second amplifier and an opposite end that communicates with the output of the second amplifier. A third amplifier has an input, an output and a third transconductance. A fourth amplifier has an input that communicates with the output of the third amplifier, an output and a fourth transconductance. A third resistance has one end that communicates with the input of the third amplifier. A fourth resistance has one end that communicates with the input of the fourth amplifier and an opposite end that communicates with the output of the fourth amplifier. An opposite end of the first resistance communicates with the opposite end of the fourth resistance. An opposite end of the third resistance communicates with the opposite end of the second resistance.

In other features, the first and third transconductances are greater than the second and fourth transconductances, respectively. A first capacitance has one end that communicates with the one end of the first resistance and an opposite end that communicates with the opposite end of the first resistance. A second capacitance has one end that communicates with the one end of the third resistance and an opposite end that communicates with the opposite end of the third resistance.

A differential transimpedance amplifier circuit comprises a first amplifier with an input, an output and a first transconductance. A second amplifier has an input that communicates with the output of the first amplifier, an output and a second transconductance. A first resistance has one end that communicates with the input of the first amplifier. A second resistance has one end that communicates with the input of the second amplifier and an opposite end that communicates with the output of the second amplifier. A third amplifier has an input, an output and a third transconductance. A fourth amplifier has an input that communicates with the output of the third amplifier, an output and a fourth transconductance. A third resistance has one end that communicates with the input of the third amplifier. A fourth resistance has one end that communicates with the input of the fourth amplifier and an opposite end that communicates with the output of the fourth amplifier. A fifth amplifier has an input that communicates with the output of the second amplifier, an output and a fifth transconductance. A sixth amplifier has an input that communicates with the output of the fifth amplifier, an output and a sixth transconductance. A seventh amplifier has an input that communicates with the output of the fourth amplifier, an output and a seventh transconductance. An eighth amplifier has an input that communicates with the output of the seventh amplifier, an output and a eighth transconductance. An opposite end of the first resistance communicates with the output of the eighth amplifier. An opposite end of the third resistance communicates with the output of the sixth amplifier.

In other features, the first and third transconductances are greater than the second and fourth transconductances, respectively. The second and fourth transconductances are greater than the fifth and sixth and the seventh and eighth transconductances, respectively. The second and fourth transconductances are approximately equal to one-fourth of the first and third transconductances, respectively. The fifth and sixth transconductances and the seventh and eighth transconductances are approximately equal to one-twelfth of the first and second transconductances, respectively.

In still other features, a first capacitance has one end that communicates with the one end of the first resistance and an opposite end that communicates with the opposite end of the first resistance. A second capacitance has one end that communicates with the one end of the third resistance and an opposite end that communicates with the opposite end of the third resistance. A fifth resistance that has one end that communicates with the input of the sixth amplifier and an opposite end that communicates with the output of the sixth amplifier. A sixth resistance that has one end that communicates with the input of the eighth amplifier and an opposite end that communicates with the output of the eighth amplifier.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 15 illustrates the open loop response of the circuit of FIG. 14;

FIG. 16 is an electrical schematic of a differential circuit implementation using the circuit of FIG. 14;

FIG. 17 is a functional block diagram of the multiple amplifier circuit according to the present invention that is implemented in a read head of a disk drive system; and FIG. 18 is a functional block diagram of the multiple amplifier circuit according to the present invention that is implemented in a low noise amplifier (LNA) of a wireless device.

DETAILED DESCRIPTION OF THE PREFERRED EMBODIMENTS

Figure 1:
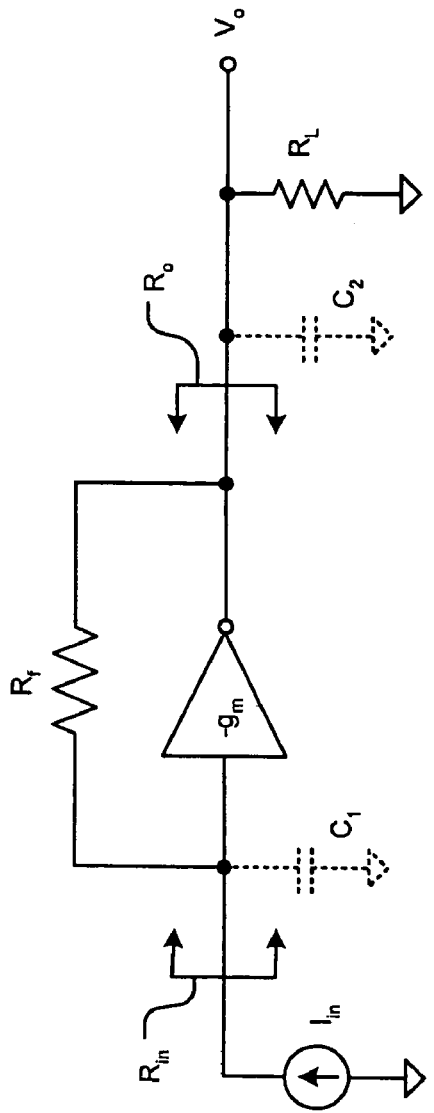
FIG. 1 is an electrical schematic of a transimpedance amplifier circuit according to the prior art.
Figure 2:
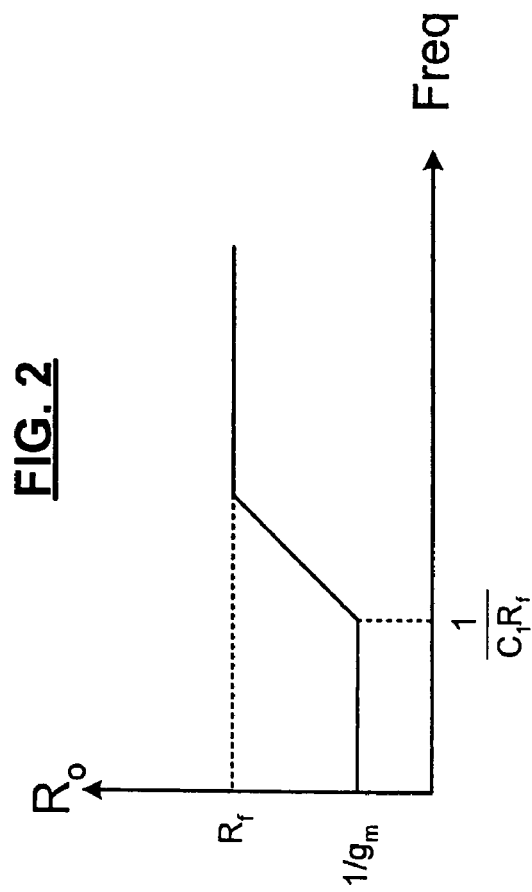
FIG. 2 is a graph illustrating output impedance as a function of frequency for the amplifier circuit of FIG. 1.
Figure 4:
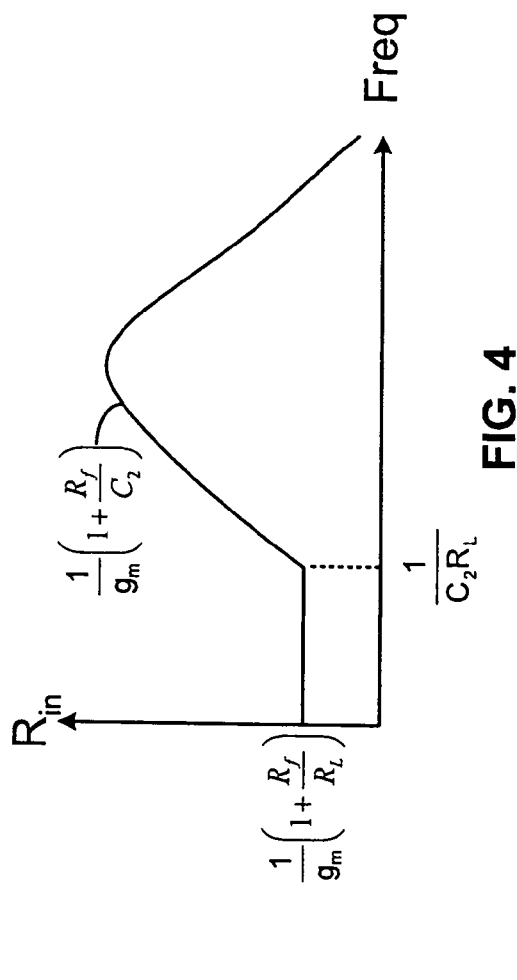
FIG. 4 is a graph illustrating input impedance as a function of frequency for the amplifier of FIG. 1.
Figure 3:
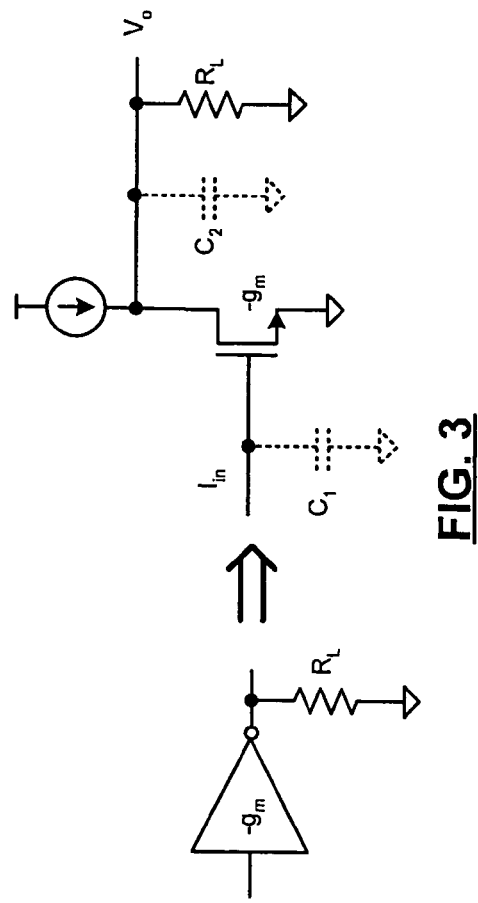
FIG. 3 is an electrical schematic of a transistor with parasitic capacitances according to the prior art.
Figure 5:
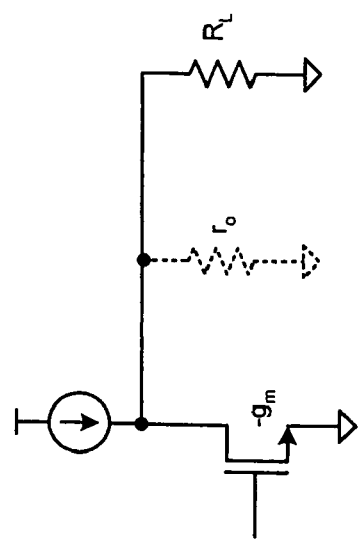
FIG. 5 is an electrical schematic illustrating the output resistance of the transistor of FIG. 3.
Figure 6:
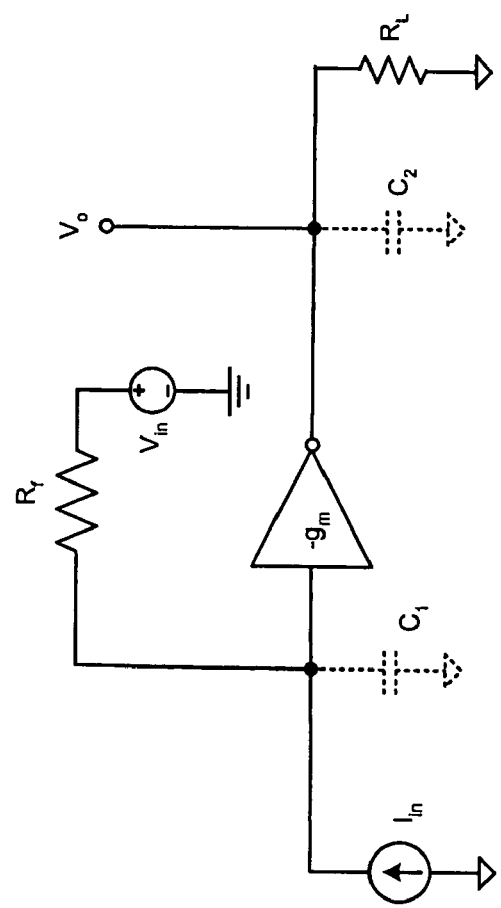
FIG. 6 is the amplifier circuit of FIG. 1 in an open loop response configuration.
Figure 7:
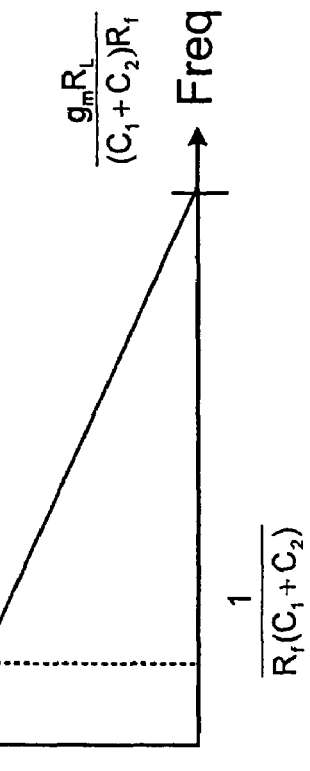
FIG. 7 illustrates the open loop response of the circuit shown in FIG. 6.

The following description of the preferred embodiment(s) is merely exemplary in nature and is in no way intended to limit the invention, its application, or uses. For purposes of clarity, the same reference numbers will be used in the drawings to identify similar elements.

Figure 8:
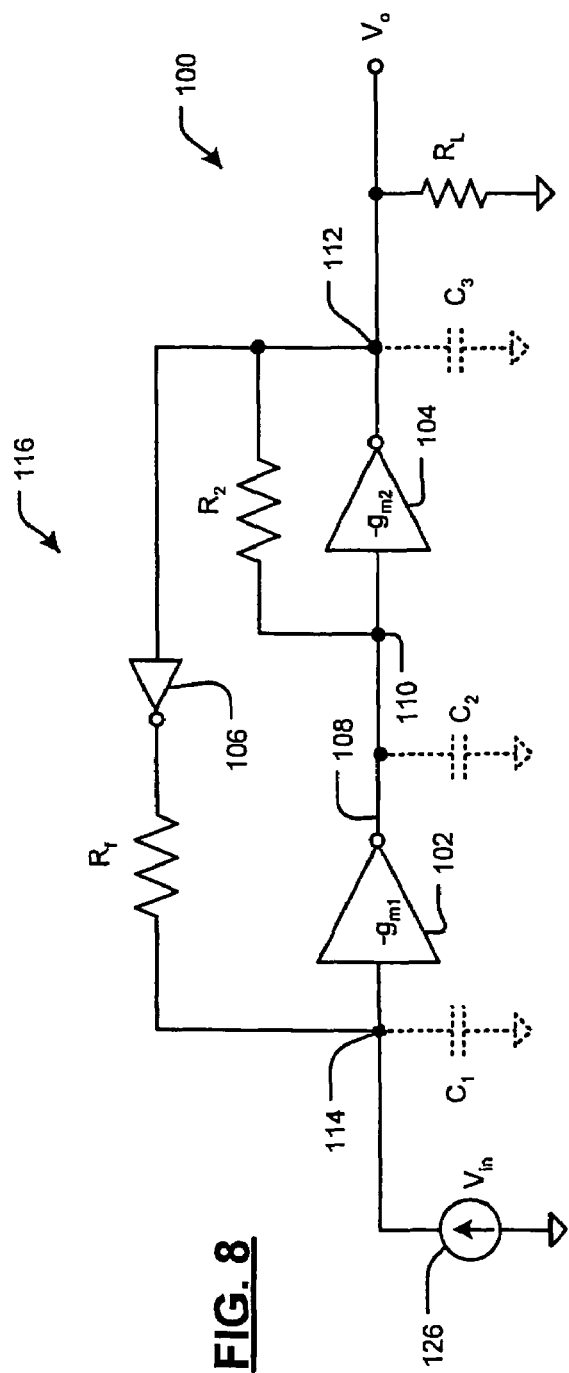
FIG. 8 is an electrical schematic of an amplifier circuit according to one embodiment of the present invention.

An amplifier circuit according to one embodiment of the present invention is illustrated in FIG. 8 and is designated by reference number 100. The circuit 100 includes a first amplifier 102 having a transconductance $g_{m1}$ and a second amplifier 104 having a transconductance $g_{m2}$. The first and second amplifiers 102, 104 are connected in series. Specifically, an output 108 of the first amplifier 102 is coupled to an input 110 of the second amplifier 104.

An output 112 of the second amplifier 104 is coupled to an input 114 of the first amplifier 102 through a feedback circuit 116. The feedback circuit 116 includes a feedback resistance $R_f$ and an inverter 106. In one implementation, the inverter 106 has a gain equal to −1, although other gain values can be used. A resistance $R_2$ is coupled in parallel with the second amplifier 104. Also shown in FIG. 8 are parasitic capacitances $C_1$, $C_2$, and $C_3$. An input current source $I_{in}$ 126 is coupled to the input terminal 114 of the first amplifier 102. A load resistance $R_L$ is coupled to the output terminal 112 of the second amplifier 104. In this implementation, $g_{m1}$ is preferably greater than $g_{m2}$. The amplifiers 102, 104 can be inverting CMOS amplifiers (although other transistor types may be used), and the parasitic capacitances $C_1$ and $C_2$ are preferably much larger than the parasitic capacitance $C_3$.

Figure 9:
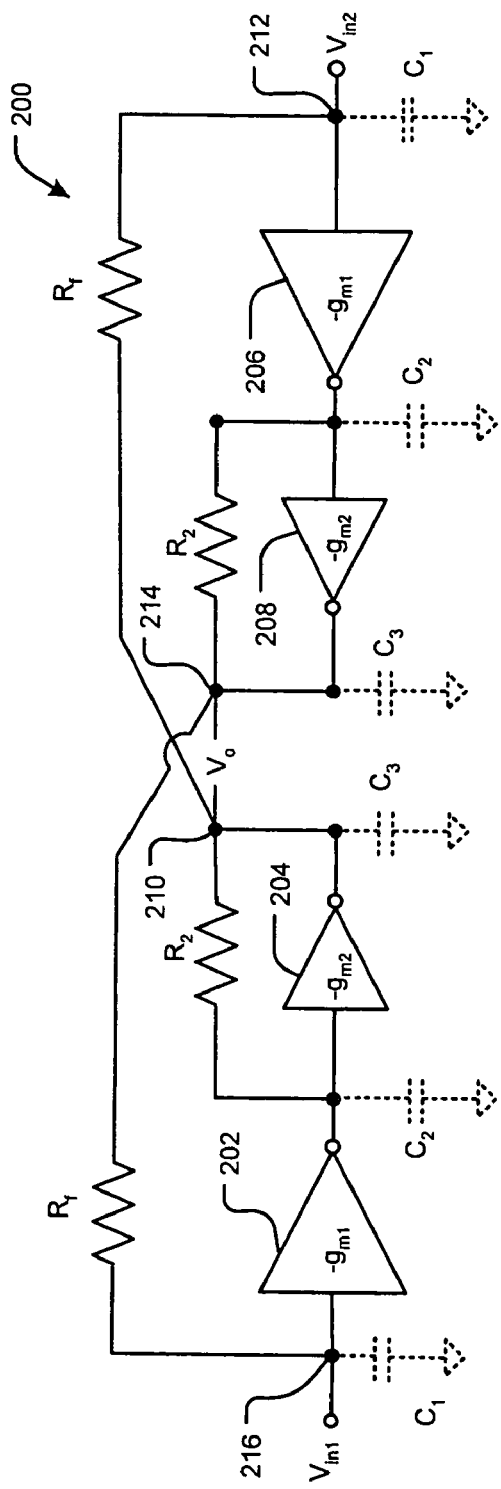
FIG. 9 is an electrical schematic of a differential circuit implementation of the circuit of FIG. 8.

Referring now to FIG. 9, a differential circuit 200 corresponding to the circuit 100 shown in FIG. 8 is illustrated. The differential circuit 200 includes a first set of amplifiers 202, 204 connected in series and having transconductances $g_{m1}$ and $g_{m2}$, respectively. A second set of amplifiers 206, 208 are connected in series and have transconductances $g_{m1}$ and $g_{m2}$, respectively. An output 210 of the first set of amplifiers is coupled to an input 212 of the second set of amplifiers through a feedback resistance $R_f$. An output 214 of the second set of amplifiers is coupled to an input 216 of the first set of amplifiers through a feedback resistance $R_f$. Negative feedback is achieved by feeding the output 210 from the first set of amplifiers to the input 212 of the second set of amplifiers 206, 208, and vice versa.

The effective transconductance $g_{m\text{-}eff}$ of the differential circuit 200 of FIG. 9 is given by the following equation:

$$g_{m\text{-}eff} = \frac{\frac{g_m R_2}{R_L}}{g_{m2} R_L + 1} \approx g_{m2} \cdot g_{m1} \cdot R_2.$$

Therefore, the overall transconductance for the differential circuit 200 is greater than the amplifier circuit that is shown in FIG. 1. Even if amplifiers 202, 206 have the same transconductance $g_m$ as the amplifier of FIG. 1, the overall transconductance $g_{m\text{-}eff}$ is the product of this transconductance multiplied by $g_{m2}$ and $R_2$ for the circuit of FIG. 9.

The input impedance for the differential circuit of FIG. 9 is as follows:

$$R_{in} = \frac{1}{g_{m\_eff}}\left(1 + \frac{Rf}{R_L}\right) \Rightarrow \frac{1}{g_{m2}g_{m1}R_2}\left(1 + \frac{Rf}{1/g_m}\right) \approx \frac{1}{g_{m2}g_{m1}R_2} + R_f g_{m1} R_2$$

Note that, in this embodiment, $R_L$ is not shunted because the parasitic capacitance $C_3$ is relatively low. Therefore, the differential circuit 200 is capable of higher frequency operation than the amplifier circuit of FIG. 1.

Figure 10:
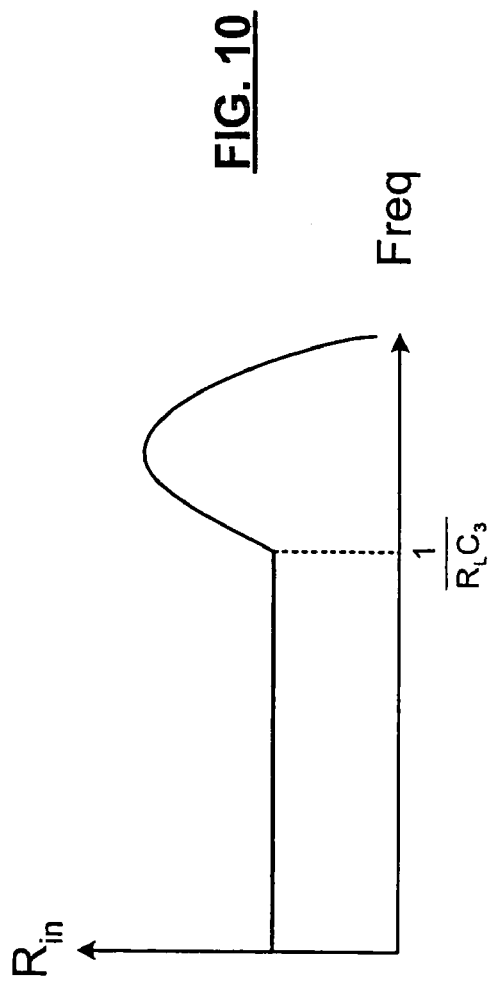
FIG. 10 is a graph illustrating input impedance as a function of frequency for the differential circuit of FIG. 9.

Referring now to FIG. 10, the input impedance is shown as a function of frequency. The input impedance is relatively flat or constant to a higher frequency $$\left(\text{i.e., } \frac{1}{R_L C_3}\right)$$

as compared to the input impedance for the circuit of FIG. 1. Moreover, in the differential circuit of FIG. 9, the value of the feedback resistance $R_f$ can be increased as desired for increased gain because this resistance $R_f$ is not limited by the output impedance as in FIG. 1.

Relative to the amplifier circuit of FIG. 1, the output impedance of the amplifier circuits shown in FIGS. 8 and 9 is also increased because the second amplifier 104 has a low transconductance $g_{m2}$ and a high output impedance. Thus, the overall output impedance is not limited by the second amplifier 104, and is merely limited by the load impedance $R_L$. The noise of the amplifier circuits 100, 200 is similar to the amplifier circuit of FIG. 1 because the noise of the first amplifier 102 dominates the overall noise for the circuit, and the noise generated by the second amplifier 104 is divided by $g_{m1}$.

Figure 11:
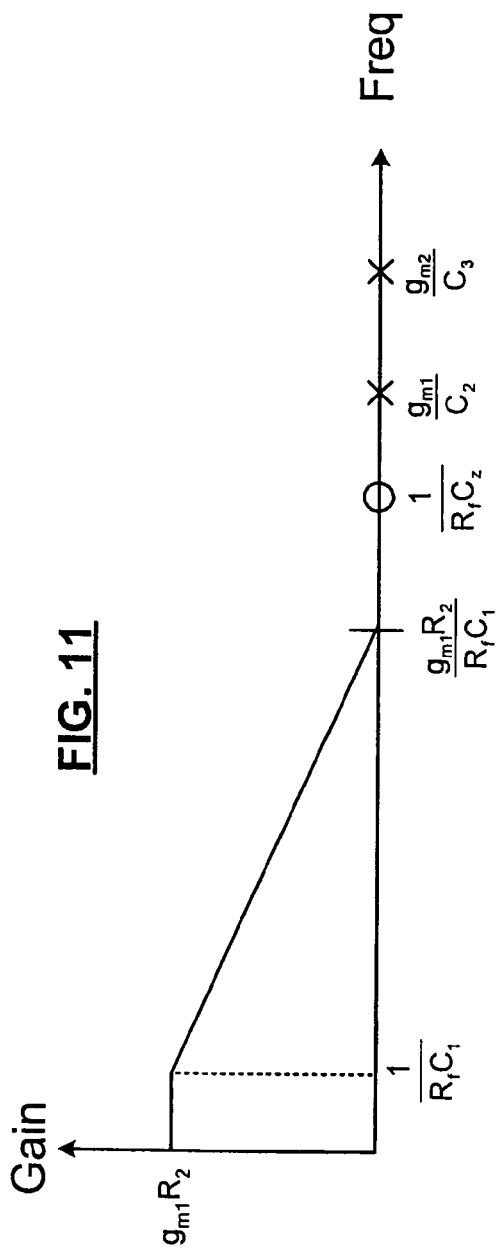
FIG. 11 illustrates the open loop response of the differential circuit of FIG. 9.

Referring now to FIG. 11, the open loop response of the differential circuit of FIG. 9 is illustrated using the open loop response technique described above. As shown therein, at DC, the capacitor $C_1$ is effectively an open circuit and the input impedance is high, so the DC gain of the open loop response is equal to $g_{m1} \cdot R_2$. There is a dominant pole at $$\frac{1}{R_f C_1}$$

and the crossover frequency is $$\left( \frac{g_{m1} \cdot R_2}{R_f C_1} \right).$$

As compared to the amplifier circuit of FIG. 1, the crossover frequency is determined by the resistance $R_2$ rather than the load impedance $R_L$. Therefore, the resistance $R_2$ can be increased to increase bandwidth. Further, the crossover frequency is a function of one capacitor $C_1$ not two. Thus, given the same transconductance $g_{m1}$ as the circuit of FIG. 1, the bandwidth of the differential circuit 200 will be greater. However, there are two nondominant poles at $$\frac{g_{m1}}{C_2} \text{ and } \frac{g_{m2}}{C_3}.$$

These poles set an upper limit on the differential circuit's bandwidth.

Figure 12:
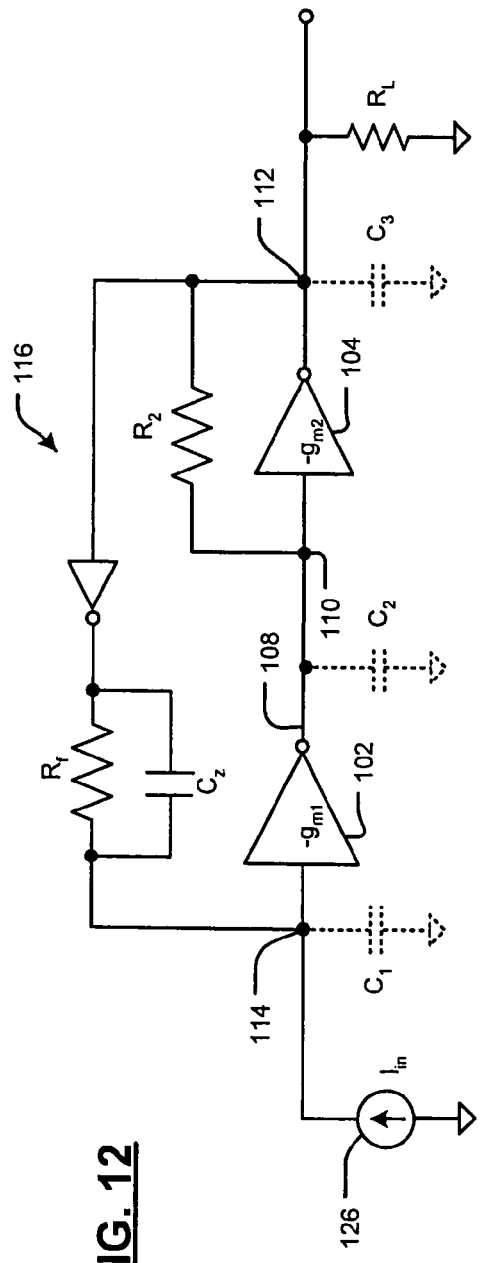
FIG. 12 is an electrical schematic of an amplifier circuit according to another embodiment of the present invention.

Referring now to FIG. 12, to mitigate this problem, a capacitor $C_z$ can be coupled in parallel across the feedback resistance $R_f$ in the differential mode, as shown in the half-circuit illustrated in FIG. 12. The capacitor $C_2$ adds a zero at a frequency of $$\frac{1}{R_f C_z}$$

as shown in FIG. 1.

Figure 13:
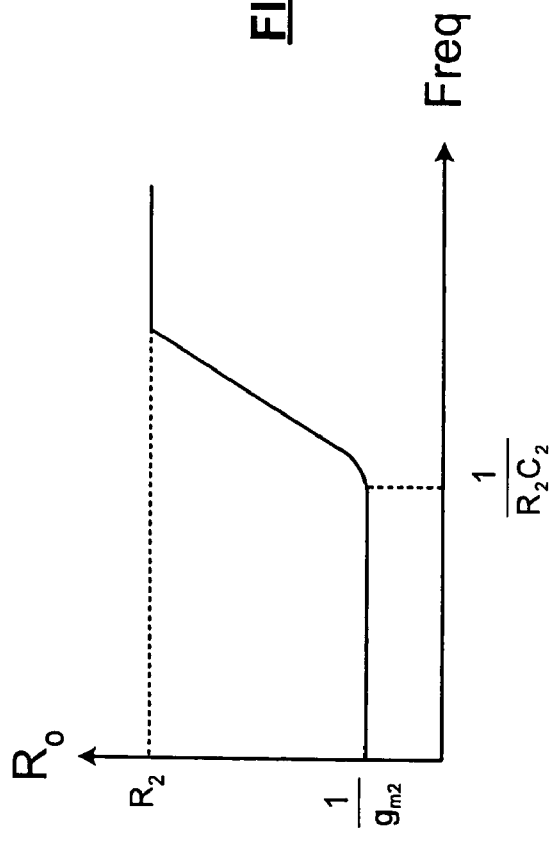
FIG. 13 is a graph illustrating the output impedance as a function of frequency for the differential circuit of FIG. 9.

Referring now to FIG. 13, the transconductance $g_{m1}$ is noise dependent and is typically set to a level corresponding to minimal noise. Therefore, the transconductance $g_{m1}$ cannot be further increased to further enhance the bandwidth of the differential circuit 200. The feedback resistance $R_f$ is set by the input impedance $R_{in}$, so those two variables are generally fixed. As the resistance $R_2$ is increased to increase bandwidth, at some point the output impedance is affected. This is illustrated in FIG. 13, where it can be seen that the output impedance $R_o$ of the differential circuit 200 is relatively constant or flat up to a frequency of approximately $$\frac{1}{R_2 C_2}.$$

Moreover, and with further reference to FIG. 11, at a frequency of $$g_{m2} = \frac{R_2}{C_2},$$

$R_o$ increases. Therefore, by increasing the resistance $R_2$, one of the nondominant poles moves down in frequency, which limits bandwidth. For all of these reasons, the resistance $R_2$ generally cannot be increased without restraint.

Figure 14:
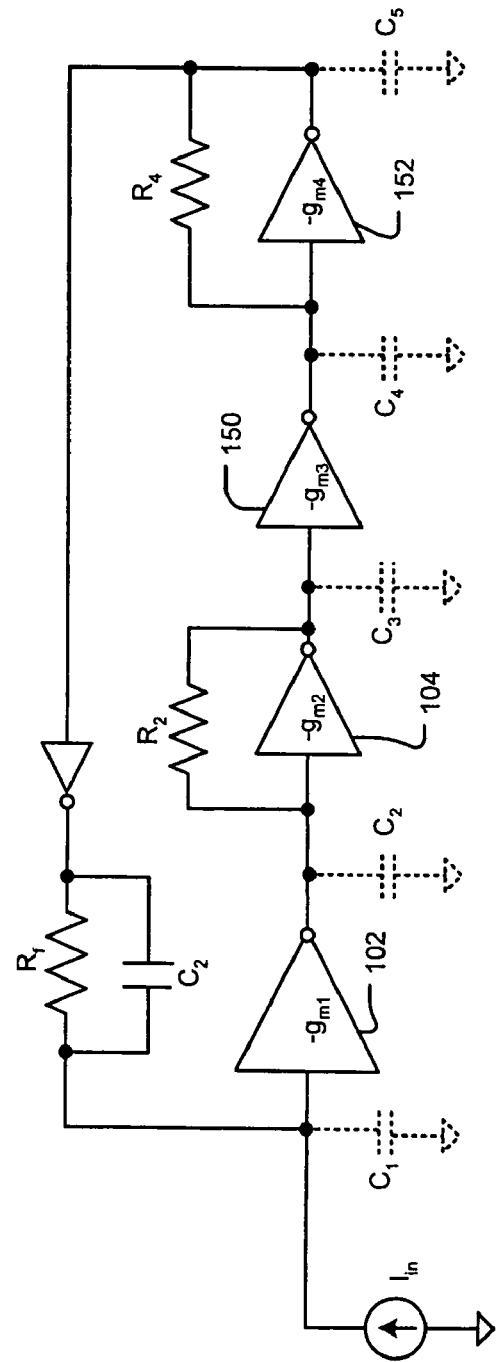
FIG. 14 is an electrical schematic of an amplifier circuit including additional amplifier stages according to yet another embodiment of the present invention.

Referring now to FIG. 14, another embodiment of an amplifier circuit is shown that mitigates the problems described above by increasing the transconductance $g_{m2}$ of the second amplifier 104, adding amplifiers 150, 152, and reducing the resistance $R_2$. In the embodiment of FIG. 14, the transconductance of the amplifier 104 is approximately one-quarter of the amplifier 102. The transconductance of amplifiers 150, 152 are approximately one-twelfth of amplifier 102. As used herein, the term approximately means within +/−0.25% of the designated value.

Referring now to FIGS. 15 and 16, the open loop response of the circuit of FIG. 14 is illustrated using the open loop response technique. Note that three nondominant poles occur at very high frequencies due to fact that the parasitic capacitances $C_3$, $C_4$, and $C_5$ have a relatively low value. The lowest nondominant pole also occurs at a relatively high frequency since the resistance $R_2$ has a relatively low value. As for the crossover frequency, note that the transconductance $g_{m1}$ is fixed for noise purposes, the feedback resistance $R_f$ is fixed by the input impedance $R_{in}$, capacitor $C_1$ is fixed, and the resistance $R_2$ is set low for bandwidth purposes. However, transconductances $g_{m3}$ and $g_{m4}$ can be adjusted to further increase bandwidth. Thus, the circuit of FIG. 14 provides even greater flexibility in achieving a high gain, high bandwidth amplifier with other desirable circuit characteristics. In FIG. 16, a differential embodiment of the circuit of FIG. 14 is illustrated. Note that the parasitic capacitances have been omitted in FIG. 16.

Referring now to FIGS. 17 and 18, several exemplary implementations of the multiple amplifier circuit 200 are shown. The multiple amplifier circuit 200 may be any of the multiple amplifier circuits shown in FIGS. 8-16. In FIG. 17, the multiple amplifier circuit 200 according to the present invention is implemented in a read head 202 of a disk drive system 204. In FIG. 18, the multiple amplifier circuit 200 is implemented in a low noise amplifier (LNA) 210 of a wireless device 212. For example, the wireless device 212 may be compliant with Bluetooth networks, cellular networks, and/or Ethernet networks such as 802.11a, 802.11b, 802.11n, 802.11g, 802.16 and/or other present and future wireless standards.

Skilled artisans will appreciate that there are a wide variety of other applications for the multiple amplifier circuit according to the present invention. As can be appreciated, the resistance and capacitances can be implemented in a wide variety of ways including but not limited to discrete elements such as resistors and capacitors, nonlinear variable resistors and capacitors, and/or transistor-based resistances and capacitances. Still other variations are contemplated.

Those skilled in the art can now appreciate from the foregoing description that the broad teachings of the present invention can be implemented in a variety of forms. For example, the present invention can be applied to a wide variety of applications including, for example, CMOS readers. Therefore, while this invention has been described in connection with particular examples thereof, the true scope of the invention should not be so limited since other modifications will become apparent to the skilled practitioner upon a study of the drawings, specification, and the following claims.

What is claimed is:

1. A transimpedance amplifier circuit comprising:
   a first transconductance amplifier having an input, an output and a first transconductance;
   a second transconductance amplifier having an input that communicates with said output of said first transconductance amplifier, an output and a second transconductance;
   a first resistance having one end that communicates with said input of said first transconductance amplifier; and
   an inverter that has an input that communicates with said output of said second transconductance amplifier and an output that communicates with an opposite end of said first resistance, wherein an input of said transimpedance amplifier circuit communicates with said input of said first transconductance amplifier.

2. The transimpedance amplifier circuit of claim 1 wherein said first transconductance is greater than said second transconductance.

3. The transimpedance amplifier circuit of claim 1 further comprising a second resistance having one end that communicates with said input of said second transconductance amplifier and an opposite end that communicates with said output of said second transconductance amplifier.

4. The transimpedance amplifier circuit of claim 1 further comprising a third resistance having one end that is connected to said output of said second transconductance amplifier.

5. The transimpedance amplifier circuit of claim 1 further comprising a first capacitance having one end that communicates with said one end of said first resistance and an opposite end that communicates with said opposite end of said first resistance.

6. A transimpedance amplifier circuit comprising:
   first transconductance amplifying means for amplifying and having an input, an output and a first transconductance;
   second transconductance amplifying means for amplifying and having an input that communicates with said output of said first transconductance amplifying means, an output and a second transconductance;
   first resistance means for providing resistance and having one end that communicates with said input of said first transconductance amplifying means; and
   an inverting means for inverting and having has an input that communicates with said output of said second transconductance amplifying means and an output that communicates with an opposite end of said first resistance means,
   wherein an input of said transimpedance amplifier circuit communicates with said input of said first transconductance amplifier.

7. The transimpedance amplifier circuit of claim 6 wherein said first transconductance is greater than said second transconductance.

8. The transimpedance amplifier circuit of claim 6 further comprising second resistance means for providing resistance and having one end that communicates with said input of said second transconductance amplifying means and an opposite end that communicates with said output of said second transconductance amplifying means.

9. The transimpedance amplifier circuit of claim 6 further comprising third resistance means for providing resistance and having one end that is connected to said output of said second transconductance amplifying means.

10. The transimpedance amplifier circuit of claim 6 further comprising first capacitance means for providing capacitance and having one end that communicates with said one end of said first resistance means and an opposite end that communicates with said opposite end of said first resistance means.

* * * * *